United States Patent
Coni et al.

(10) Patent No.: US 6,404,353 B1
(45) Date of Patent: Jun. 11, 2002

(54) METHOD FOR OPTIMIZING THE DETECTION OF THE CONTACT POINT OF TACTILE CAPACITANCE SURFACE

(75) Inventors: Philippe Coni, Saint Jean d'Illac; Pierre Fagard, Elancourt, both of (FR)

(73) Assignee: Sextant Avionique, Velizy Villacoublay (FR)

( * ) Notice: Subject to any disclaimer, the term of this patent is extended or adjusted under 35 U.S.C. 154(b) by 0 days.

(21) Appl. No.: 09/331,166

(22) PCT Filed: Dec. 19, 1997

(86) PCT No.: PCT/FR97/02366
§ 371 (c)(1),
(2), (4) Date: Jun. 21, 1999

(87) PCT Pub. No.: WO98/28708
PCT Pub. Date: Jul. 2, 1998

(30) Foreign Application Priority Data

Dec. 20, 1996 (FR) ............................................. 96 15744

(51) Int. Cl.$^7$ ......................... H03K 17/94; H03M 11/00
(52) U.S. Cl. ...................... 341/33; 178/18.06; 307/108; 361/283.1
(58) Field of Search ................... 341/33, 34; 178/18.06; 307/99, 108, 116; 361/283.1, 283.2; 200/600

(56) References Cited

U.S. PATENT DOCUMENTS

| | | | | |
|---|---|---|---|---|
| 3,657,475 A | * | 4/1972 | Peronneau et al. | 178/18.06 |
| 4,394,643 A | * | 7/1983 | Williams | 341/33 |
| 4,475,235 A | * | 10/1984 | Graham | 341/33 |
| 4,550,310 A | * | 10/1985 | Yamaguchi et al. | 341/33 |
| 4,710,766 A | | 12/1987 | Dubois et al. | |
| 5,801,682 A | | 9/1998 | Coni et al. | |

* cited by examiner

Primary Examiner—Timothy Edwards, Jr.
(74) Attorney, Agent, or Firm—Oblon, Spivak, McClelland, Maier & Neustadt, P.C.

(57) ABSTRACT

A process for detecting the point of touching of a tactile surface. A high frequency signal is sequentially supplied to four corners of a plate having a capacitive surface. This is accomplished by supplying one diagonal with the others being idle. The output voltages are measured at the four corners for all the various possible positions of touching. Relations between voltages are established from these measurements obtained for each diagonal. During touching, the relations obtained are compared with those stored in order to locate the point of touching.

9 Claims, 5 Drawing Sheets

METHOD FOR OPTIMIZING THE DETECTION OF THE CONTACT POINT OF TACTILE CAPACITANCE SURFACE

BACKGROUND OF THE INVENTION

1. Field of the Invention

The present invention relates to a process for optimizing the detection of the point of touching of a capacitive tactile surface.

2. Discussion of the Background

French Patent Application No. FR-A-2,732,135 (or European Patent Application EP-A-0,733,990) discloses a capacitive tactile surface taking the form of a square or rectangular glass slab covered with a conducting transparent layer (generally made of ITO, that is to say indium tin oxide), the whole being coated with an anti-reflection layer which also acts as dielectric insulant. The conducting layer is uniform and is supplied with high-frequency energy alternately at each of its corners, via a reference capacitance, the opposite corner being earthed and the other two corners being "idle".

The point of touching of this known tactile surface can be determined with correct accuracy, but in certain cases of use, under unfavourable conditions (for example when the surface is misty, if the user is wearing gloves or when the surface of contact between the finger and the slab is large and/or of irregular shape, etc.), the determination of the desired point of touching may be erroneous.

SUMMARY OF THE INVENTION

The aim of the present invention is a process which makes it possible to determine with the greatest possible accuracy, for a tactile surface of the aforesaid type, the point of touching by the user, even under the most unfavourable conditions.

BRIEF DESCRIPTION OF THE DRAWINGS

The present invention will be better understood on reading the detailed description of an embodiment taken by way of non-limiting example and illustrated by the appended drawing in which.

DETAILED DESCRIPTION OF THE PREFERRED EMBODIMENTS

Figure 1:
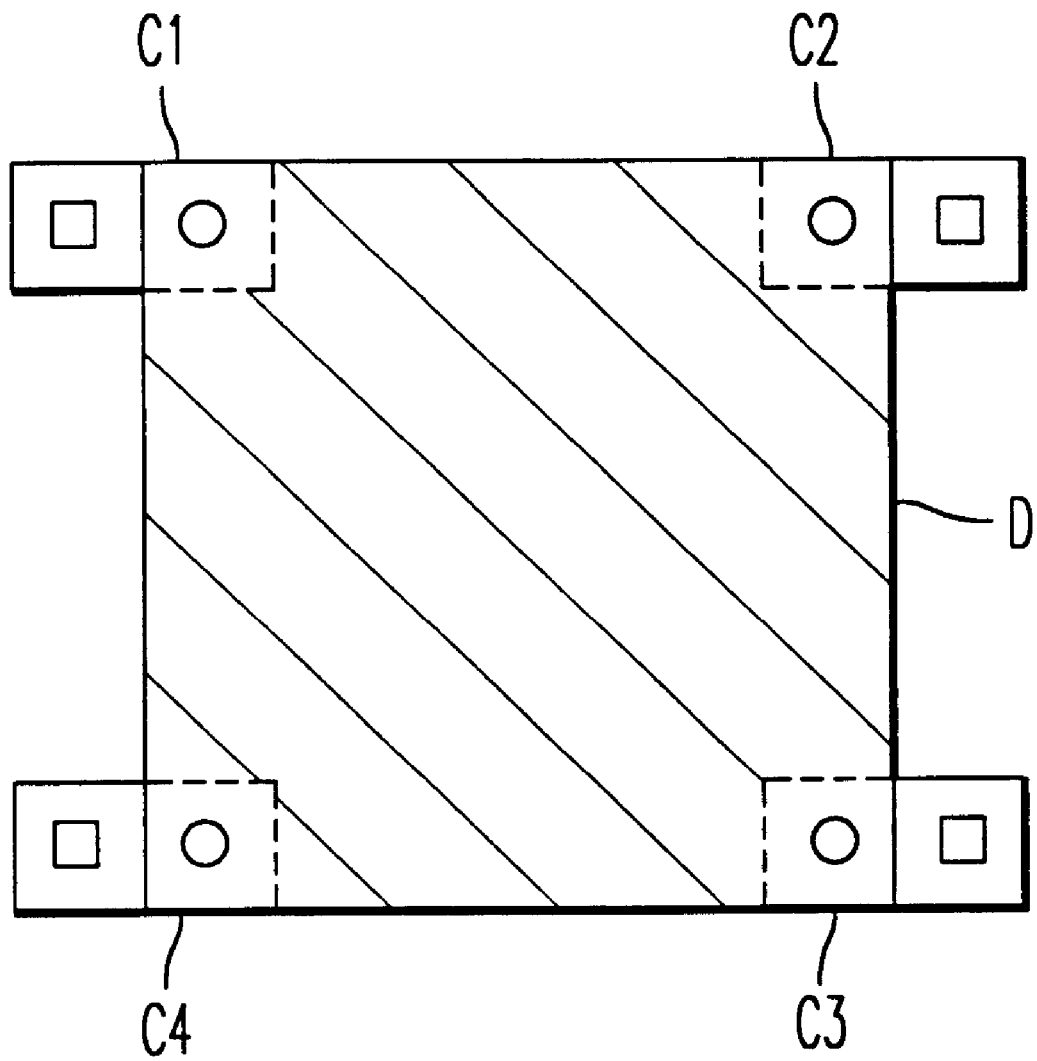
FIG. 1 is a front view of a capacitive tactile plate such as used by the invention.

The process of the invention is implemented on a tactile surface such as that described in the aforesaid French Patent Application FR-A-2,732,135. Consequently, this patent application may be referred to as regards details of construction of the metallized glass slab and of its supply and signal processing circuits. The objective of the present process is the optimization of the determination of the point of touching of the plate constituting this tactile surface. This optimization makes it possible, in particular, to determine in the most accurate possible manner the point of the surface which the user designates, especially when he does not use a tip to do so, but presses more or less strongly the flat part of his finger onto the surface, even if his hands are gloved and if the surface is misty or humid. It will easily be understood that under such conditions the surface of contact between the finger of the user and the glass slab may vary within wide proportions and that its shape may be very irregular. Consequently, the capacitance added by the user's finger may likewise vary within wide proportions.

Let C1 to C4 be the four corners of the slab D, which are alternately supplied with high-frequency energy in the manner described in the abovementioned French Patent Application. Sensitivity in relation to a given corner of the slab is defined as the difference between the output signal from the slab (as gathered by the signal processing circuit linked alternately to each of the corners of the slab) with and without pressing by the user's finger. Let S1 to S4 be the sensitivities relating to the corners C1 to C4 respectively.

In general, the sensitivity depends, for a given geographical position, anywhere on the slab (in its useful zone, of course), on the value of the capacitance Ch added by the user, this capacitance itself depending on the nature of the pressing (for example with or without gloves, more or less strong pressing, degree of ambient humidity, etc.). The sensitivity is also a function of the resistance of the metallic layer of the slab, and more precisely of the resistance $R_{t1}$ between the supplied corner and the point of touching, and of the resistance $Rt_2$ between the point of touching and the opposite corner, which is earthed. These two values $Rt_1$ and $Rt_2$ are characteristic of the location of the point of touching.

When the capacitance added by the user can vary within wide proportions, the sensitivity of the slab, which is proportional to this added capacitance ($S=k.C_h$), also varies within wide proportions, and acts unfavourably on the quality of the detection of the output signal from the slab, and hence on the accuracy of the locating of the point of touching. The present invention is aimed at eliminating this factor of influence so as to improve the accuracy of detection.

Let us consider the sensitivities relating to one and the same diagonal of the slab, for example S1 and S3. We can write:

$$S1=k.f(R_{t1}, R_{t2}) \quad S3=k.f(R_{t2}, R_{t1}).$$

The factor k is representative of the capacitance added by the user. It is therefore invariant for one and the same pressing (pressing under the same conditions on the slab). Now, it may be supposed that since the connecting of the four corners of the slab to the high-frequency voltage source is done electronically very rapidly (in less than one millisecond for example), the conditions of pressing on the slab do not have time to vary between the measurements of S1 and S3. The factor k can therefore be supposed invariant, and can be eliminated from the relations between S1 and S3 by factorization and division. In this way the said parameter or coefficient Kpos is defined, this being the position coefficient associated with a pressing on any point lying on the relevant diagonal. In the case of the diagonal S1–S3, we have:

$$Kpos = \frac{S1}{S1+S3}$$

By knowing Kpos, it is possible to locate the position of pressing on the diagonal C1–C3. It suffices to associate with each value of Kpos a position on this diagonal C1–C3. Of course, the same goes for the diagonal C2–C4.

To determine the position of pressing off-diagonal, it is necessary to know the equipotential lines (defined below) giving the same value of kpos. By proceeding in the same way while supplying the corners relating to the other diagonal, another value of kpos and another series of equipotential lines are determined. The off-diagonal site of pressing is determined at the crossing of the two equipotential lines corresponding to the two kpos relating to the supplying of the two diagonals of the tactile surface. Of course, this determination can only be made after at least one complete cycle of supplying the four corners C1 to C4 of the tactile surface. To improve the accuracy of measurement, it is preferable to carry out several cycles and to average the results obtained while eliminating, as appropriate, those lying outside a specified bracket.

Figure 2:
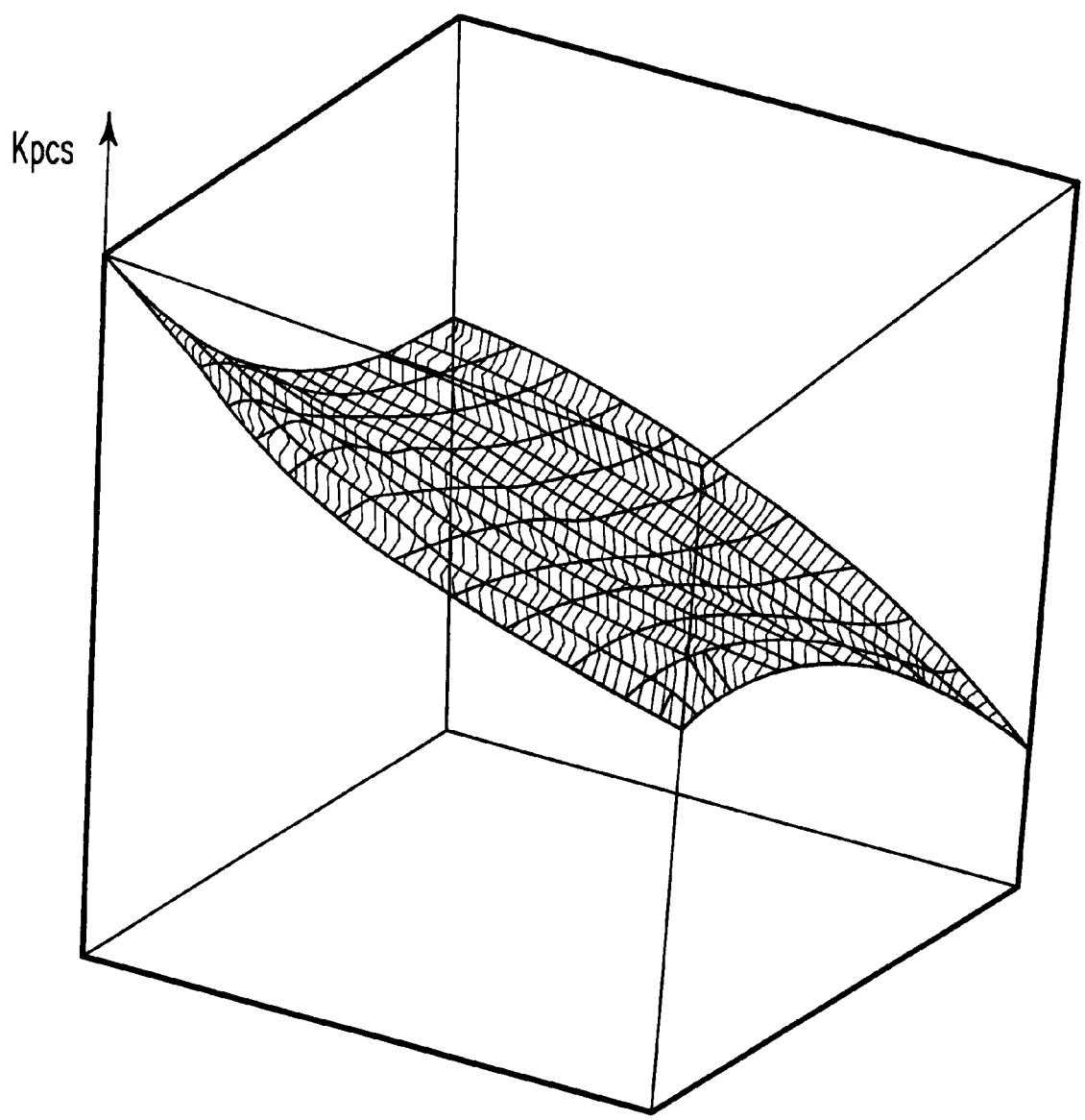
FIGS. 2 and 3 are respectively a left surface representing a chart of equipotentials in accordance with the invention, and its projection onto a plane.
Figure 3:
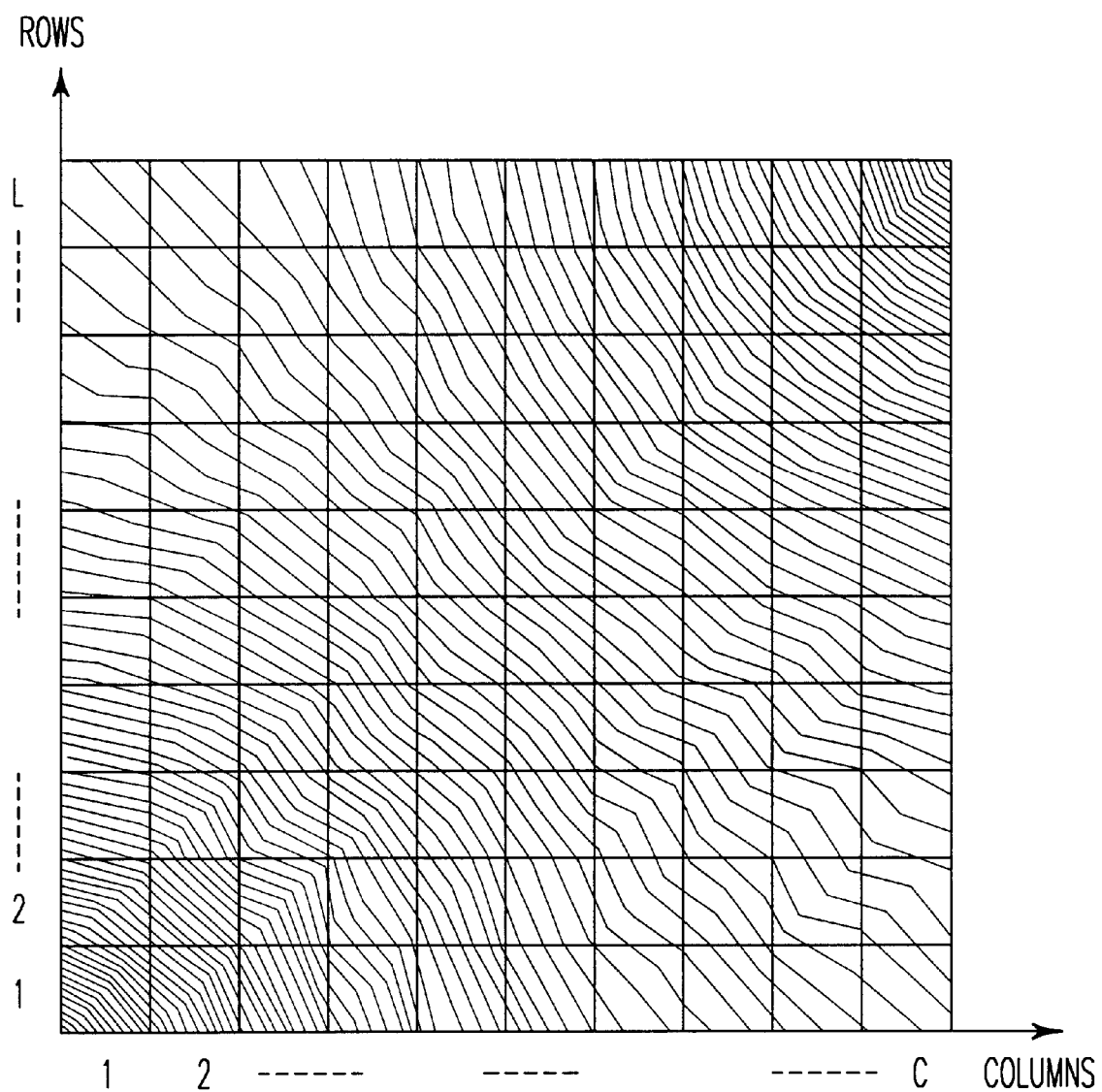

The term equipotential line denotes a curve joining all the points to which there corresponds one and the same position coefficient Kpos. To chart these equipotential lines, the surface of the slab is divided into a chess board containing a number of rows and columns. Measurement of the position coefficients for each of the zones thus discretized is then performed for the two diagonals. The number of rows and columns depends on the resolution sought for determining the place of pressing. Represented in FIG. 2 is an example of such charts, for one of the diagonals. The set of curves obtained forms a left surface (not plane). This set of curves can be projected vertically onto a plane. Represented in FIG. 3 are the curves obtained after projection. In particular, a continuous decrease (or an increase, depending on the direction) from one corner to the opposite corner is observed, that is to say the curves do not cut one another, this implying that there cannot be any ambiguities in determining the place of pressing from the measurement of the position coefficient: to a given value of Kpos1 there corresponds one equipotential and one only for a supplying of the corners C1 and C3. Likewise, to a given value of kpos2 there corresponds a single equipotential for a supplying of the corners C2 and C4. The point of pressing therefore lies at the intersection of these two equipotentials.

One of the advantageous characteristics of the tactile surface used to implement the process of the present invention is to allow confirmation of the pressing by the operator on the surface. Thus, the glass plate is linked at its four corners to its support by electrically conducting strips to which strain gauges are fixed. These strain gauges are linked to a processing circuit which produces a confirmation signal once a specified pressure is exerted on the plate. As long as no pressure is exerted, the value of the output voltage gathered on each of the four corners of the surface is stored. These various values are averaged and stored over a sufficiently long period as and when in a memory on condition that they lie within a specified bracket. Thus, a refreshing of the contents of the memory is performed constantly, this making it possible to eliminate the influence of the drifting of the characteristics of the tactile surface, which drifting is in particular dependent on temperature, and also on hygrometry. Thus, four reference values at rest are obtained which make it possible to calculate the corresponding sensitivities.

When the circuit for processing the signals from the strain gauges detects a sufficiently large variation in their signals, corresponding to a pressing on the tactile surface, it commands the acquisition of the output voltages from the four corners of the surface, and the difference is calculated between these output voltages and the said stored values so as to deduce the various sensitivities S1 to S4. The values of Kpos1 (on the diagonal C1–C3) and Kpos 2 (on the diagonal C2–C4) are deduced from the sensitivity values thus calculated.

Any point of pressing on the plate, with coordinates (i, j), is characterized by a pair of values {Kpos1 (i, j), Kpos2 (i, j)}. If the relevant point is the centre of any one of the elementary zones defined on the plate (see FIG. 3), by charting the value pairs which relate to the centres of all the zones of the plate, a table characterizing this plate is obtained. This table contains L.C such pairs, L being the number of rows of zones and C the number of columns of zones of the plate. Of course, for a given plate, the larger L and C are, the smaller the zones will be and the better the resolution of designation of a point of pressing will be, since, regardless of the point of pressing inside a zone thus defined, the measured point of pressing will be assumed to be the centre of the zone. This is particularly valid if the pressing is almost point-like (for example with the aid of a tip). If the surface of pressing covers several zones (pressing with the flat part of the finger), location is carried out by minimization also, the zone thus located representing for example the centre or the barycentre of the surface of pressing between the zones covered, as described below.

The characterization table, generally charted when manufacturing the tactile surface, may just as well be theoretical if the ITO layer is homogeneous and if the conditions of measurement are ideal. Otherwise, a phase of point-by-point charting is carried out so as to obtain the true values of Kpos.

Figure 4:
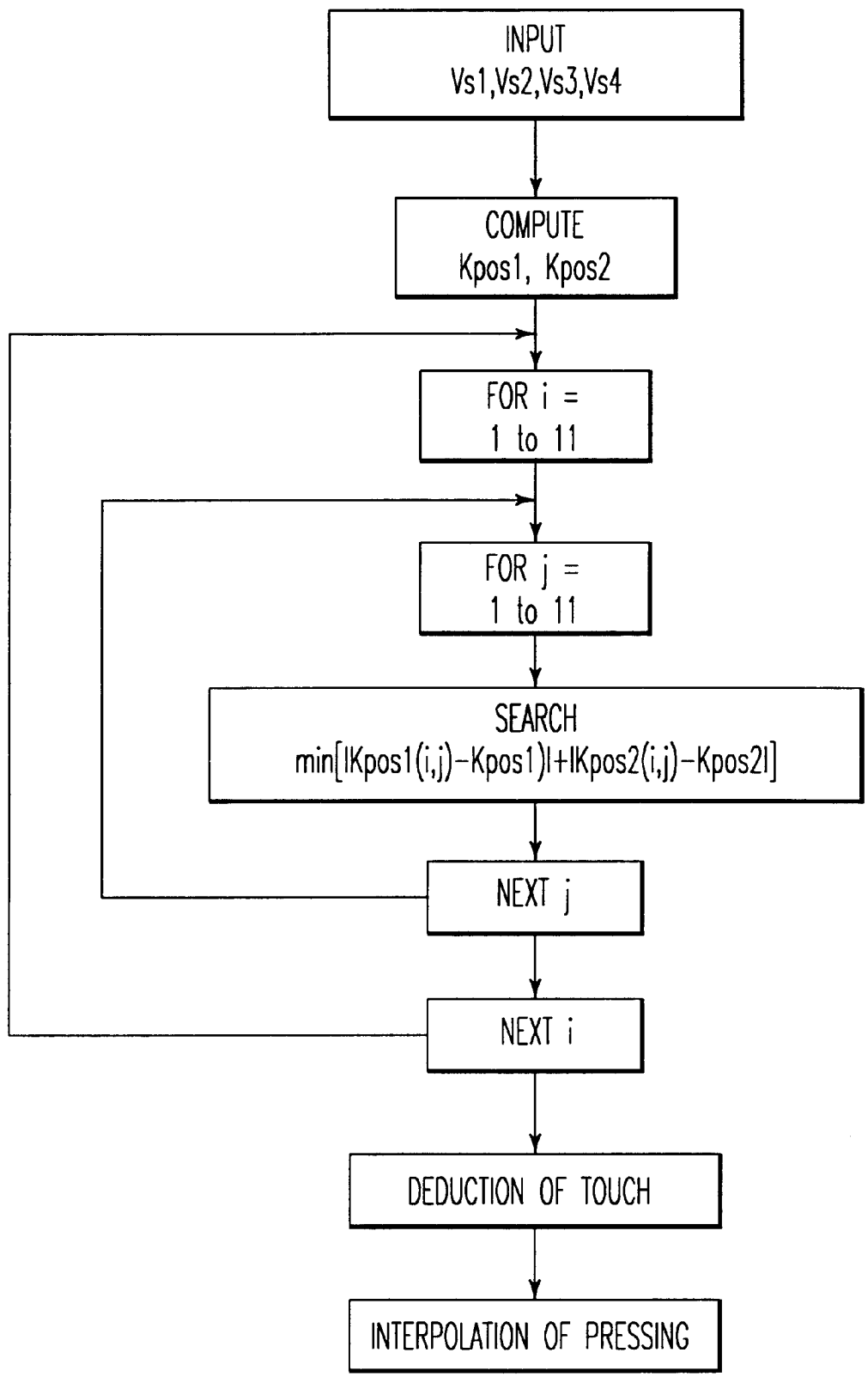
FIG. 4 is a flowchart of the steps of the process of the invention.

As illustrated in FIG. 4, following this characterization step, after having stored all the pairs of values of Kpos, it is possible to locate a pressing at any point of the plate by calculating the corresponding values Kpos1 and Kpos2 (in accordance with the measurements of the output voltages gathered at each of the four corners of the plate, just before pressing and just after, this giving the corresponding sensitivities, and hence Kpos1 and Kpos2 thus obtained), the said plate characterization table is searched to find the pair of values of Kpos which are closest to the pair of values just obtained, this amounting to minimizing the difference between the pair of values obtained and the various pairs stored in the table. The following operation is performed during the scanning of this table:

$$\min \{|Kpos1(i, j) - Kpos1| + |Kpos2(i, j) - Kpos2|\}$$

a formula in which Kpos1 (i, j) and Kpos2 (i, j) are the values encountered in the said table during the scanning thereof, whereas Kpos1 and Kpos2 are the values calculated in accordance with the measurements performed during the touching of the plate.

A resolution equal to one zone (such as defined above) may prove to be insufficient. It would be conceivable to increase this resolution by increasing the number of rows and columns of zones of the plate, but this would prohibitively increase the size of the said correction matrix (in which are stored the updated values of the output voltages from the corners of the plate while there is no pressing on this plate). To avoid this, an advantageous characteristic of the invention makes provision to perform an interpolation in the neighbourhood of the zone just determined following the minimization operation. To this end, an interpolation is performed in the neighbourhood of the zone determined following minimization.

Figure 5:
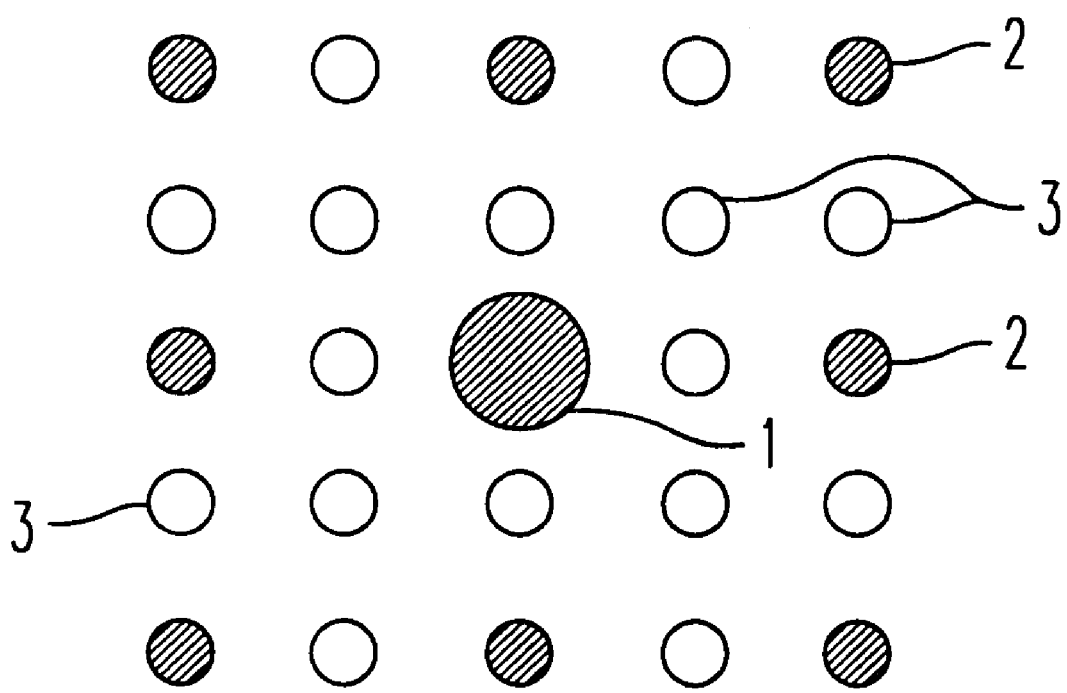
FIG. 5 is a partial view of the plate of FIG. 1, serving to explain the interpolation step according to, the invention.

Represented in FIG. 5 is a part of the surface of the plate, in which a large black dot 1 represents the position of pressing determined after minimization, and small black dots represent the eight neighbouring positions. In the portion of surface P delimited by these eight neighbouring positions 2, the coefficients Kpos1 and Kpos2 corresponding to the intermediate positions 3, represented by empty circles, are calculated by interpolation (linear for example). These intermediate positions lie on rows and columns which are equidistant from the rows L and columns C as determined in the manner explained above, the spacing of these intermediate positions being equal to half the spacing of positions 1 and 2. By knowing the coefficients of position 1 and of positions 2 and 3, a position search is performed according to the minimization process explained above, limited to the portion of surface P. In this way the resolution of determination of the point of pressing is doubled both in the direction of the rows and in that of the columns. It is even possible to repeat this interpolation several times in succession so as further to increase the resolution, if the uniformity of deposition of electrically conducting material (ITO) of the plate and the accuracy of measurement so permit.

The process of the invention also makes it possible to detect wear, and in particular irregular wear of the ITO deposition. For this purpose, the initial values of the various sensitivities are stored for all the zones of the L rows and C columns of the plate, and they are regularly compared with the measured values. According to an advantageous characteristic of the invention, on each occasion two opposite corners of the slab D are supplied through a resistor inserted in series between earth and the corner opposite to that supplied with HF voltage (as indicated for example in the said French Patent Application No. 95 03505). Thus, when the point of touching is very close to a corner, the signal gathered by the said processing circuit is not zero, and the position coefficient can be neither zero nor equal to 1, but must lie within a bracket of values, itself lying between 0 and 1. This bracket of values can be termed the likelihood domain and is charted for a new device operating properly. Consequently, if the processing circuit determines a position coefficient outside this likelihood domain, a fault (such as a cut in the metallized layer) or excessive wear of the metallized layer can be concluded.

The tactile surface to which the process of the invention applies can also be used in conjunction with a microprocessor in the guise of a device for controlling the displacements of a cursor (device of the so-called "Touch Pad" type).

What is claimed is:

1. Process for optimizing the detection of the point of touching of a rectangular capacitive tactile surface according to which the conducting layer is supplied with high-frequency energy successively at each of its corners via a reference capacitance, the opposite corner to the corner supplied with power being earthed and the other two corners being "idle", characterized in that it includes a first step which consists in determining along each of the diagonals of the tactile surface, for a number of points corresponding to the sought-after resolution, the values of a parameter which is dependent on the two output voltages obtained by successively supplying each of the corners at which the relevant diagonal terminates, and also dependent on the position of the point of touching on the relevant diagonal, the said parameter being independent of the value of the capacitance added by the user at the point of touching, then in determining, for points distributed over the whole surface of the slab, the values of the said parameter relating to one of the diagonal then the values of the said parameter relating to the other diagonal, in storing the pairs of parameters as a function of the coordinates of each of the corresponding points, and a second step of determining the position of the point of touching which consists, on the basis of a measured pair of output voltages after successive supplying of the four corners of the tactile surface in determining the said two parameters respectively associated with the two diagonals and, in retrieving from memory the corresponding and unique coordinates of the point of touching on the basis of these two parameters.

2. Process according to claim 1, characterized in that a likelihood domain is defined for the parameters charted for a new device operating properly, and the charted values of the parameters are compared with the likelihood domain during operation of the device, the values lying outside the domain corresponding to a fault or to excessive wear of the device.

3. Process according to claim 1, characterized in that the said parameter of each angle is determined, for the supply to the ends of each diagonal of the surface, by a ratio $S1/(S1+S3)$ between the respective sensitivities $S1$ and $S3$ viewed from the two respective ends of the diagonal, the sensitivity being defined as the difference between the voltage charted at the relevant end in the absence of touching and that charted during touching.

4. Process according to claim 3, characterized in that a likelihood domain is defined for the parameters charted for a new device operating properly, and the charted values of the parameters are compared with the likelihood domain during operation of the device, the values lying outside the domain corresponding to a fault or to excessive wear of the device.

5. Process according to claim 1, characterized in that the coordinates of the point of touching are searched for in the memory by minimizing the difference between the parameters calculated in accordance with the measurements of output voltages and those residing in memory.

6. Process according to claim 5, characterized in that the said parameter of each angle is determined for the supply to the ends of each diagonal of the surface, by a ratio $S1/(S1+S3)$ between the respective sensitivities $S1$ and $S3$ viewed from the two respective ends of the diagonal, the sensitivity being defined as the difference between the voltage charted at the relevant end in the absence of touching and that charted during touching.

7. Process according to claim 5, characterized in that a likelihood domain is defined for the parameters charted for a new device operating properly, and the charted values of the parameters are compared with the likelihood domain during operation of the device, the values lying outside the domain corresponding to a fault or to excessive wear of the device.

8. Process according to claim 5, characterized in that an interpolation of the values of the two parameters is performed in the neighbourhood of the zone determined following minimization, in order to increase the resolution of detection.

9. Process according to claim 8, characterized in that a likelihood domain is defined for the parameters charted for a new device operating properly, and the charted values of the parameters are compared with the likelihood domain during operation of the device, the values lying outside the domain corresponding to a fault or to excessive wear of the device.

* * * * *